United States Patent
Adusumilli et al.

(10) Patent No.: US 9,934,977 B1
(45) Date of Patent: Apr. 3, 2018

(54) SALICIDE BOTTOM CONTACTS

(71) Applicant: INTERNATIONAL BUSINESS MACHINES CORPORATION, Armonk, NY (US)

(72) Inventors: Praneet Adusumilli, Albany, NY (US); Alexander Reznicek, Troy, NY (US); Oscar van der Straten, Guilderland Center, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/418,097

(22) Filed: Jan. 27, 2017

(51) Int. Cl.
*H01L 21/28* (2006.01)
*H01L 21/26* (2006.01)
*H01L 21/285* (2006.01)
*H01L 29/66* (2006.01)
*H01L 21/265* (2006.01)
*H01L 29/423* (2006.01)
*H01L 29/786* (2006.01)

(52) U.S. Cl.
CPC .. *H01L 21/28518* (2013.01); *H01L 21/26513* (2013.01); *H01L 29/42392* (2013.01); *H01L 29/665* (2013.01); *H01L 29/66553* (2013.01); *H01L 29/66666* (2013.01); *H01L 29/78618* (2013.01); *H01L 29/78642* (2013.01)

(58) Field of Classification Search
CPC ......... H01L 21/28518; H01L 21/26513; H01L 21/00; H01L 21/02; H01L 21/443; H01L 21/473; H01L 21/26; H01L 21/28; H01L 21/02244; H01L 21/02614; H01L 21/02258; H01L 21/02554; H01L 21/02565

USPC .......................................................... 257/329
See application file for complete search history.

(56) References Cited

U.S. PATENT DOCUMENTS

| 5,956,578 | A | 9/1999 | Weitzel et al. |
| 6,762,802 | B2 * | 7/2004 | Ono ................. G02F 1/134363 349/38 |
| 7,230,286 | B2 | 6/2007 | Cohen et al. |
| 7,446,025 | B2 | 11/2008 | Cohen et al. |
| 7,749,905 | B2 | 7/2010 | Cohen et al. |

(Continued)

OTHER PUBLICATIONS

Larrieu, G. et al., "Vertical nanowire array-based field effect transistors for ultimate scaling" Nanoscale (Jan. 2013) pp. 2437-2441, vol. 5.

*Primary Examiner* — Chuong A Luu
(74) *Attorney, Agent, or Firm* — Tutunjian & Bitetto P.C.; Daniel P. Morris

(57) ABSTRACT

A method of forming a contact to a semiconductor device that includes forming a vertically orientated channel region on semiconductor material layer of a substrate; and forming a first source/drain region in the semiconductor material layer. The method may continue with forming a metal semiconductor alloy contact on the first source/drain region extending along a horizontally orientated upper surface of the first source/drain region that is substantially perpendicular to the vertically orientated channel region, wherein the metal semiconductor alloy contact extends substantially to an interface with the vertically orientated channel region. Thereafter, a gate structure is formed on the vertically orientated channel region, and a second source/drain region is formed on the vertically orientated channel region.

13 Claims, 6 Drawing Sheets

(56) References Cited

U.S. PATENT DOCUMENTS

| | | | |
|---|---|---|---|
| 7,879,662 B2* | 2/2011 | Bae | H01L 27/124 257/E21.414 |
| 7,999,309 B2 | 8/2011 | Yoon et al. | |
| 8,409,953 B2 | 4/2013 | Yoon et al. | |
| 9,299,835 B1 | 3/2016 | Anderson et al. | |
| 2008/0293246 A1 | 11/2008 | Cohen et al. | |
| 2010/0052055 A1 | 3/2010 | Takeuchi | |
| 2015/0236134 A1 | 8/2015 | Zhong et al. | |
| 2017/0316953 A1* | 11/2017 | Zhang | H01L 21/473 |

* cited by examiner

US 9,934,977 B1

SALICIDE BOTTOM CONTACTS

BACKGROUND

Technical Field

The present disclosure relates to contact structures and structures for transmitting electrical current.

Description of the Related Art

Modern integrated circuits are made up of literally millions of active devices such as transistors and capacitors. These devices are initially isolated from one another but are later interconnected together to formed functional circuits. The quality of the interconnection structure drastically affects the performance and reliability of the fabricated circuit. Interconnects and contacts are typically formed to bring and transmit electrical signals to semiconductor devices.

SUMMARY

In one embodiment, a method of forming a contact to a semiconductor device is provided, in which the contact is a silicide, also referred to as a metal semiconductor alloy, and the device is a transistor having a vertically orientated channel region. In one embodiment, the method includes forming a vertically orientated channel region on semiconductor material layer of a substrate; and forming a first source/drain region in the semiconductor material layer. The method may continue with forming a metal semiconductor alloy contact on the first source/drain region. The metal semiconductor alloy contact may be formed along a horizontally orientated upper surface that is substantially perpendicular to the vertically orientated channel region. The metal semiconductor alloy contact may extend along an upper surface of an exposed portion over the semiconductor material layer of the substrate substantially to an interface with the vertically orientated channel region. Thereafter, a gate structure is formed on the vertically orientated channel region, and a second source/drain region is formed on the vertically orientated channel region.

In another embodiment, the method of forming the contact to the semiconductor device includes forming a vertically orientated channel region on semiconductor material layer of a substrate; and forming a first source/drain region in the semiconductor material layer. Thereafter, a metal semiconductor alloy contact is formed on the first source/drain region. The metal semiconductor alloy contact is present on a horizontally orientated upper surface of the first source/drain region that is substantially perpendicular to the vertically orientated channel. The metal semiconductor alloy contact extends substantially to an interface with the vertically orientated channel region. In some embodiments, an edge of the metal semiconductor alloy contact is aligned with a sidewall of the vertically orientated channel region. A gate structure is formed on the vertically orientated channel region; and a second source/drain region is formed on the vertically orientated channel region.

In another aspect, the present disclosure provides a vertical transistor that includes a vertically orientated channel region on semiconductor material layer of a substrate, and a first source/drain region in the semiconductor material layer. A metal semiconductor alloy contact is present on the first source/drain region extending along an upper surface of an exposed portion over the semiconductor material layer of the substrate substantially to an interface with the vertically orientated channel region. An edge of the metal semiconductor alloy contact is aligned with a sidewall of the vertically orientated channel region. A gate structure is present on the vertically orientated channel region. A second source/drain region is present on the vertically orientated channel region.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
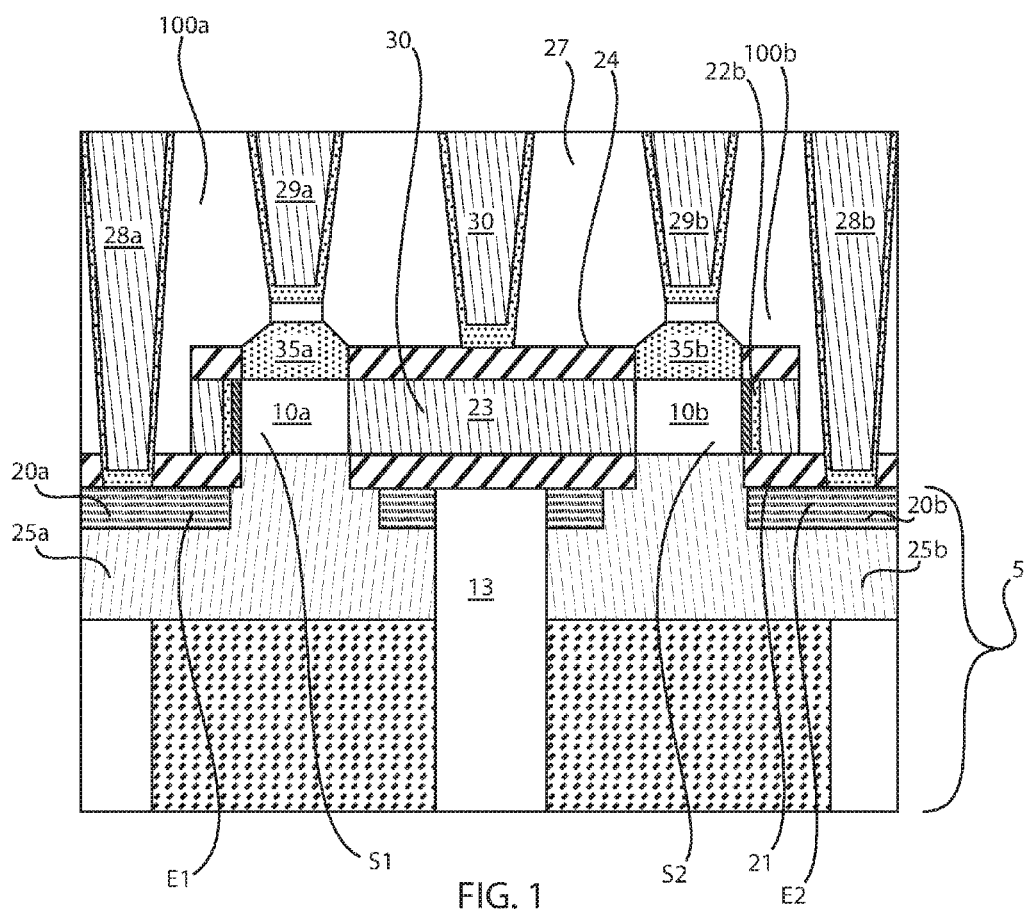
FIG. 1 is a side cross-sectional view of one embodiment of a device including a plurality vertically orientated channel regions, in which the first source/drain region that is positioned on the supporting substrate has a contact composed of a metal semiconductor alloy that has an edge aligned with a sidewall of the vertically orientated channel, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

With increasing scaling for next generation semiconductor devices, vertical field effect transistors (vFETs) have become increasingly attractive. For example, vertical FET devices are attractive for 5 nm device architecture due to sub-30 nm fin pitch and since they are not constrained by the contact poly pitch (CPP) and gate width scaling. However, VTFET devices typically have asymmetric source and drain due to the geometry. For example, the bottom S/D regions (whether source or drain by design) that are present on the supporting substrate can contribute to the external resistance. Further, the bottom contact silicide formation is also a challenge due to the larger aspect ratio for trench silicide (TS) contact trench.

It has been determined that there is a need to reduce the bottom distributed resistance in order to decrease the overall external resistance of the device. It has further been determined, that an early silicide contact formation for the bottom S/D can enable a larger contact length, and lower sheet resistance, and thus decrease the overall external resistance. In some examples described herein, an early bottom silicide contact will also enable flexibility in the design of the trench silicide (TS) contact—either as a partially strap over the active region (RX) of the device, or as a series of vias landing on the bottom silicide, thus reducing the trench silicide contact (TS) to gate structure (PC) capacitance.

FIG. 1 depicts one embodiment of a device including a plurality vertically orientated channel regions 10a, 10b, in which the first source/drain region 15a, 15b that is positioned on the supporting substrate 5 has a contact 20a, 20b composed of a metal semiconductor alloy that has an edge E1, E2 substantially aligned with a sidewall S1, S2 of the vertically orientated channel 10a, 10b. In the embodiment depicted in FIG. 1 the device includes one vertical field effect transistors (VFET) 100a that is doped to provide an n-type conductivity type device, and one vertical field effect transistor (VFET) 100b that is doped to provide a p-type conductivity type device. It is noted that this is only one example of a device provided by the methods and structures disclosed herein, and that any number of n-type and/or p-type conductivity devices 100a, 100b may be present in regions of the device.

In some embodiments, at least one of the vertical transistors 100a, 100b includes a vertically orientated channel region 100a, 100b on semiconductor material layer of a substrate 5, and a first source/drain region 25a, 25b in the semiconductor material layer. The vertical transistors 100a, 100b may also include a metal semiconductor alloy contact 20a, 20b on the first source/drain region 25a, 25b. The metal semiconductor alloy contact 20a, 20b is present on a horizontally orientated upper surface of the first source/drain region that is substantially perpendicular to the vertically orientated channel region 10a, 10b. The metal semiconductor alloy contact 20a, 20b may extend along the upper surface of the first source/drain region 25a, 25b to an interface with the vertically orientated channel region 10a, 10b, wherein an edge E1 of the metal semiconductor alloy contact is aligned with a sidewall S1 of the vertically orientated channel region 10a, 10b. In some embodiments, the metal semiconductor alloy contact 20a, 20b may be present on the entirety of the upper surface of the semiconductor layer that provides the first source/drain region 25a, 25b, which is not covered by the vertically orientated channel region 10a, 10b. The vertical transistors 100a, 100b may further include a gate structure on the vertically orientated channel region; and a second source/drain region 35a, 35b on the vertically orientated channel region 10a, 10b.

A "metal semiconductor alloy", as described herein for the contacts 20a, 20b, denotes a substance with metallic properties, composed of two or more chemical elements of which at least one is a metal and another is a semiconductor. As used herein, "metallic" is a material with electrically conductive properties. In some embodiments, the electrically conductive properties of the metal semiconductor alloy material can have a sheet resistance of less than 50 Ohm/square. In another example, the sheet resistance of the metal semiconductor alloy material can be less than 25 Ohm/square. In another example, the sheet resistance of the metal semiconductor alloy material ranges from 10 Ohm/square to 20 Ohm/square.

In some embodiments, the metal semiconductor alloy contact is of a composition selected from the group consisting of titanium nickel silicide, titanium platinum silicide, titanium nickel germanide, titanium platinum germanide, and combinations thereof. Some other examples of compositions that are suitable for the metal semiconductor alloy material that provides the contacts 20a, 20b depicted in FIG. 1 include, but are not limited to, tungsten silicide ($WSi_x$), tantalum silicide ($TaSi_x$), niobium silicide ($NbSi_x$), or vanadium silicide ($VSi_x$), wherein x ranges from 1.6 to 2.4. In one example, the metal semiconductor alloy material may be composed of $TiSi_x$, with x ranging from 1.60 to 1.99. In one example, the metal semiconductor alloy material is comprised of $TiSi_x$ with x ranging from 2.01 to 2.40. The metal semiconductor alloy material may be composed of a material comprised of $TiSi_x$ with inclusion of up to 10 atomic percent Ta or Nb. In another embodiment, high temperature metals that form silicides with <50 uOhm-cm sheet resistivity such as Ta, Hf, Zr & Nb may be employed in the metal semiconductor alloy that provides the contacts 20a, 20b. The aforementioned compositions are provided for illustrative purposes only and are not intended to limit the present invention.

The term "substantially" as used to describe the positioning of the contacts 25a, 25b to the sidewall S1, S2 of the vertically orientated channel 10a, 10b means that the alignment of the edge E1, E2 may be offset than no more than a thickness of the gate dielectric 26 of the gate structure 25 that is present on the vertically oriented channel 10a, 10b.

This provides a bottom silicide contact structure (hereafter referred to as "metal semiconductor alloy", as not limited to only silicon containing materials) with a larger contact length. For example, the contact 20a, 20b of the metal semiconductor alloy may extend across an entire upper surface of the semiconductor layer of the substrate 5 in which the first source/drain region 15a, 15b is present.

The metal semiconductor alloy that provides the contact 20a, 20b may have a thickness ranging from 2 nm to 100 nm. In another example, the metal semiconductor alloy that provides the contact 20a, 20b may have a thickness ranging from 2 nm to 50 nm. In some examples, the metal semiconductor alloy that provides the contact 20a, 20b may have a thickness of 2 nm, 5 nm, 10 nm, 15 nm, 20 nm, 25 nm, 30 nm, 40 nm, 50 nm or any range of thicknesses having an upper limit and a lower limit provided by one of the aforementioned examples. In some embodiments, a thick bottom metal semiconductor alloy contact structure 10a, 10b can provide a low sheet resistance, which can range from 5 Ohm/sq to 50 Ohm/sq. Other thicknesses that are lesser than or greater than the aforementioned thickness range can also be used for the metal semiconductor alloy material 22.

The semiconductor device structure 100a, 100b depicted in FIG. 1 is now described in greater detail in the following description for a method to fabricate an early bottom metal semiconductor alloy contact 20a, 20b, e.g., silicide or germanide, in a vertical field effect transistor (VFET) process flow post bottom S/D formation. In the embodiments depicted, one polarity of the device 100a, 100b may be formed at a time without the need for extra masks. In one embodiment, dual bottom silicide contacts may be formed using the method depicted in FIGS. 2A-9, e.g., titanium silicide on first source/drain region 25a for the n-type FET 100a and $Ti_{1-x}Ni_x$ or $Ti_{1-x}Pt_x$ silicide/germanide on first source/drain region 25b for the p-type FET 100b. In some embodiments, additional implants to the contacts 20a, 20b are performed after silicide formation to reduce contact resistivity. For example, phosphorus (P) or arsenic (As) implants can reduce the contact resistivity of the contacts 20a on the NFET 100a side of the device, and boron (B) or gallium (Ga) implants can reduce the contact resistivity of the contacts 20b on the PFET 100b side of the device. Embodiments are disclosed herein which includes a partially strapped TS trench contact or TS via contacts. Some embodiments of the methods and structures disclosed herein, are now described in more detail with reference to FIGS. 2A-9.

Figure 2A:
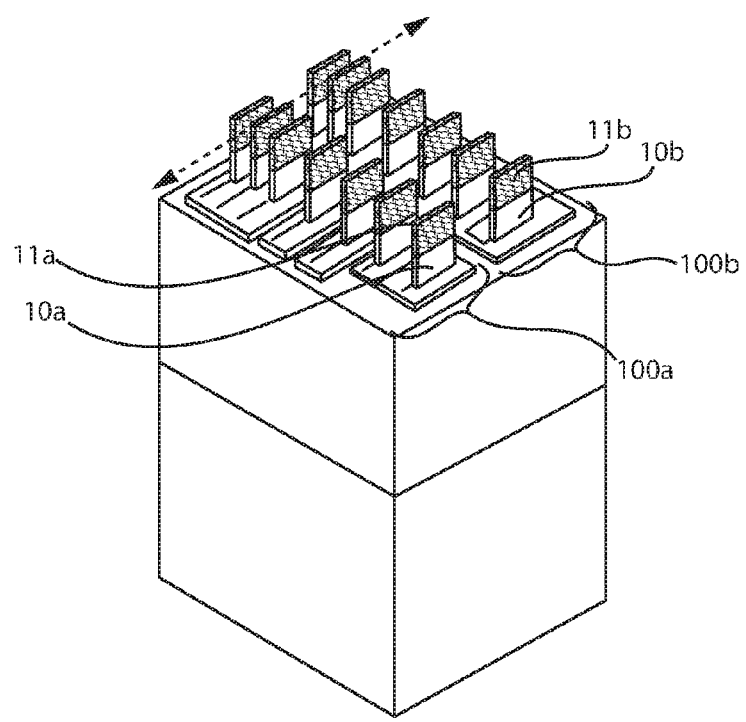
FIG. 2A is a perspective view depicting a fin cut that is applied to a plurality of fin structures, in accordance with one embodiment of the present disclosure.
Figure 2B:
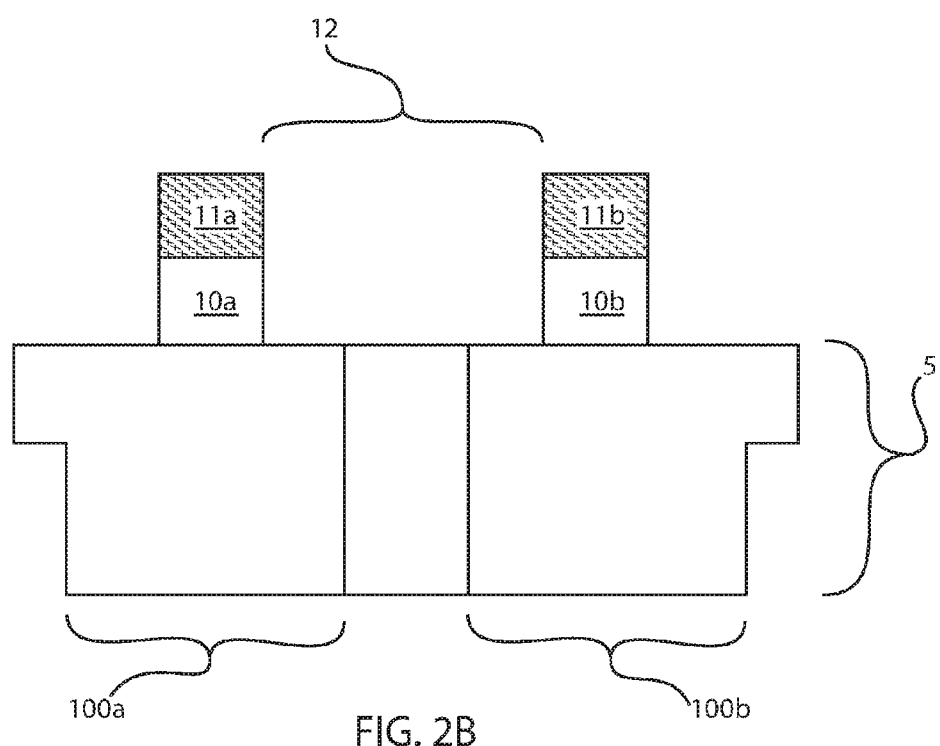
FIG. 2B is a side cross-sectional view along section line X-X, as depicted in FIG. 1A.

FIGS. 2A and 2B depict forming a plurality of fins on a substrate 5 followed by performing a fin cut procedure to define a first set of fins 10a for producing at least one first conductivity type device 100a, e.g., an n-type field effect transistor (NFET), and a second set of fins 10b for producing at least one second conductivity type device 100b, e.g., a p-type field effect transistor (PFET).

The fin structures 10a, 10b are typically present on a semiconductor substrate 5. The semiconductor substrate 5 may be a bulk substrate, a semiconductor on insulator (SOI) substrate or any other similarly used substrate for semiconductor devices. In some embodiments, the semiconductor substrate 5, e.g., the upper portion of the semiconductor substrate 5 on which the fin structures 10a, 10b are present, is composed of a type IV semiconductor. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. In other embodiments, the semiconductor substrate 5 may be composed of a type III-V semiconductor substrate. Examples of type III-V materials can include gallium arsenic (GaAs).

The fin structured 10a, 10b may be composed of a type IV or type III-V semiconductor. The above examples of semiconductor materials that are suitable for providing the supporting substrate 1, are suitable for providing examples of materials that can be used for the fin structures 10a, 10b. The fin structure 10 may be formed using an epitaxial growth process atop a semiconductor surface of the semiconductor substrate 5 to provide a semiconductor material layer for the fin structures 10a, 10b, which can be followed by a subtractive etch method to defined the geometry of the fin structures 10a, 10b, e.g., height and/or width. In some embodiments, the fin structures 10a, 10b may be formed using additive methods without requiring subtractive methods to dictate the geometry of the fin structures 10a, 10b. In other embodiments, the fin structures 10a, 10b may be subtractively formed from the semiconductor substrate 5.

In one example, the plurality of fin structures 10a, 10b may be formed deposition photolithography and etch processes. For example, forming the plurality of fin structures 10a, 10b may include forming a dielectric layer (for forming a hardmask 11a, 11b) on an upper surface of the semiconductor material that is being processed to provide the fin structures 10a, 10b; etching the dielectric layer using spacer image transfer (SIT) to form a hard mask 11a, 11b from the dielectric layer; and etching the semiconductor material that the hard mask 11a, 11b is present on with an anisotropic etch to a depth to provide the fin structures 10a, 10b.

In one embodiment, the patterning process used to define each of the fin structures 10a, 10b is a spacer image transfer (SIT) process. More specifically, the SIT process may be used to pattern the hardmask, wherein the hardmask is then used in an etch process to define the fin structures 11a, 11b. The SIT process can include forming a mandrel material layer (not shown) on the layer that provides the hard mask 11a, 11b. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., amorphous carbon. The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the dielectric layer that provides the hardmask 11a, 11b.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 10a, 10b.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the dielectric layer that provides the hard mask 11a, 11b. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. Following patterning of the hard mask 11a, 11b, the spacers formed during the SIT process can be removed. For example, the dielectric spacers may be removed using an etch process or a planarization process. The hard mask 11a, 11b is then used to etch the underlying semiconductor layer to provide the fin structures 10a, 10b.

Similar to the etch process for patterning the hard mask 11a, 11b, the etch process for forming the plurality of fin structures 10a, 10b may be an anisotropic etch, such as reactive ion etch (RIE), plasma etch, laser etching or a combinations thereof. The etch process removes the exposed portions of the semiconductor material layer for forming the fin structures 10a, 10b selectively to the hard mask. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater, or 1000:1 or greater. Besides SIT process, other suitable patterning techniques such as lithography followed by RIE can be used to form fins 10a, 10b.

The fin structures 10a, 10b formed at this stage of the process flow may have a height ranging from 5 nm to 200 nm. In another embodiment, each of the fin structures 10a, 10b has a first height ranging from 10 nm to 100 nm. In one example, each of the fin structures 5 has a height ranging from 20 nm to 50 nm. Each of the plurality of fin structures 10a, 10b may have a width ranging from 5 nm to 20 nm. In another embodiment, each of the fin structures 10a, 10b has a width ranging from 5 nm to 15 nm. In one example, each fin structure 10a, 10b has a width that is equal to 10 nm. The pitch separating adjacent fin structures 10a, 10b may range from 10 nm to 50 nm. In another embodiment, the pitch separating adjacent fin structures 5 may range from 20 nm to 45 nm. In one example, the pitch is equal to 30 nm The fin structures 10a, 10b are arranged in regions for positioning devices with a space between adjacent regions for isolation of the devices. The section identified by reference number 12 represents the fin cut region, which is the region of the fin structure that is removed to isolate a first fin structure 10a for a first set of devices, e.g., NFETs, in a first region from a second fin structure 10b for a second set of devices, e.g., PFETs, in a second region. The fin cut region 12 may be formed using deposition, photolithography and etch processing.

In a following process step, a mask protects the fin structures 10a, 10b, while the exposed portions of the substrate 5 that are not covered by the mask are etched to form the trenches that separate the fin structures 10a corresponding to the first conductivity type devices, e.g., NFETs from the fin structures 10b corresponding to the second conductivity type devices, e.g., PFETs. The etch process may be provided by an anisotropic etch process, such as reactive ion etch (RIE). In some embodiments, the region of the device that includes the fin structures 10a for the first conductivity type devices, e.g., NFETs, is separated from the region of the device that includes fin structures 10b for the second conductivity type devices, e.g., PFETs, by an isolation region, such as a shallow trench isolation (STI) region 13.

Figure 3:
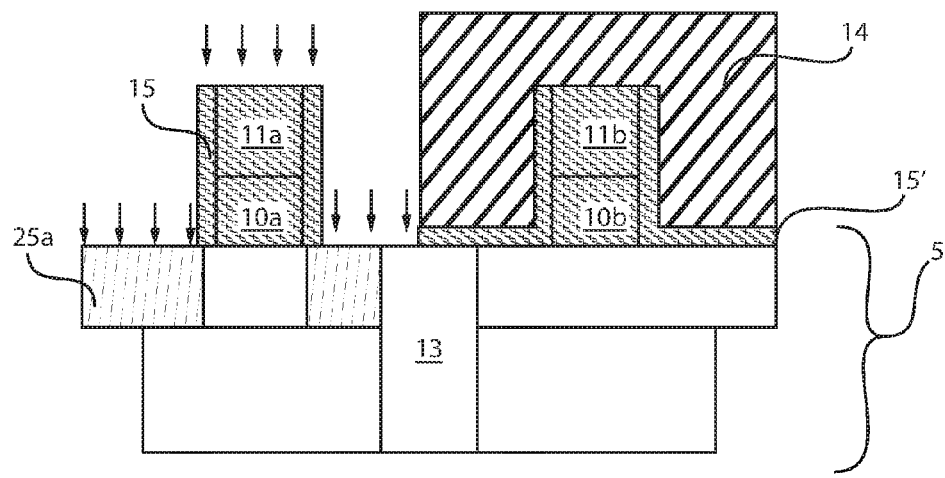
FIG. 3 is a side cross-sectional view is a side cross-sectional view depicting one embodiment of forming a first mask protecting a second set of fin structures that are being processed to form second conductivity type devices, forming a first spacer on a first set of fin structures, and implanting a semiconductor layer underlying the first fin structures to provide a first source/drain region for first conductivity type devices.

FIG. 3 depicts one embodiment of forming a first mask 14 protecting a second set of fin structures 10b that are being processed to form second conductivity type devices, forming a first spacer 15 on a first set of fin structures 10a, and implanting 16 the semiconductor surface underlying the first fin structures 10a to provide a first source/drain region 25a for forming the first conductivity type devices 100a, e.g., NFETs.

In some embodiments, before forming the first mask 14, a first conformal dielectric layer is blanket deposited on the structure depicted in FIG. 2. The first conformal dielectric layer provides the first spacer 15. The term "conformal" denotes a layer having a thickness that does not deviate from greater than or less than 30% of an average value for the thickness of the layer. The conformal dielectric layer 15 may be composed of a dielectric, such as a nitride, e.g., silicon nitride, or an oxide, e.g., silicon oxide, that can be deposited using a chemical vapor deposition (CVD) process, e.g., plasma enhanced chemical vapor deposition. It is noted that the above compositions and deposition method are illustrative, and not intended to limit the present disclosure.

In some embodiments, in a following process step, the first mask 14 is formed protecting the portion of the substrate 5 containing the second fin structure 10b, while leaving the portion of the substrate 5 containing the first fin structures 10a exposed. The first mask 14 may comprise conventional soft and/or hardmask materials and can be formed using deposition, photolithography and etching. In one embodiment, the first mask 14 comprises a photoresist. A photoresist block mask can be produced by applying a photoresist layer to the substrate surface, exposing the photoresist layer to a pattern of radiation, and then developing the pattern into the photoresist layer utilizing conventional resist developer. Alternatively, the first mask 14 can be a hardmask material. Hardmask materials include dielectric systems that may be deposited by chemical vapor deposition (CVD) and related methods. Typically, the hardmask composition includes silicon oxides, silicon carbides, silicon nitrides, silicon carbonitrides, etc. Spin-on dielectrics may also be utilized as a hardmask material including, but not limited to: silsequioxanes, siloxanes, and boron phosphate silicate glass (BPSG).

Following formation of the first mask 14, an anisotropic etch, such as reactive ion etch (RIE), is applied to the exposed portion of the conformal spacer dielectric layer that is present on the first fin structure 10a, while the portion of the conformal spacer dielectric layer that is present on the second fin structures 10b is protected by the first mask 14. In some embodiments, because of the anisotropic nature of the etch process, the horizontal portions of the conformal spacer dielectric layer may be remove, while a portion remains that is vertically oriented an the vertical sidewalls of the first fin structure 10a to provide the first spacers 15. The remaining portion of the conformal spacer dielectric layer that is protected by the first mask 14 is identified by reference number 15'.

Still referring to FIG. 3, the first source/drain region 25a can then be formed. In some embodiments, first source/drain region 25a may then be formed in the portions of the semiconductor surface of the semiconductor substrate 5 that are present on opposing sides of the first fin structure 10a. In one embodiment, the first source/drain region 25a can be formed using an ion implantation process, plasma doping, gas phase diffusion or a combination thereof. The conductivity type of the first source/drain region 25a typically dictates the conductivity type of the semiconductor device. As used herein, "p-type" refers to the addition of impurities to an intrinsic semiconductor that creates deficiencies of valence electrons. In a type IV semiconductor material, examples of p-type dopants, i.e., impurities, include but are not limited to: boron, aluminum, gallium and indium. As used herein, "n-type" refers to the addition of impurities that contributes free electrons to an intrinsic semiconductor. In a type IV semiconductor material examples of n-type dopants, i.e., impurities, include but are not limited to antimony, arsenic and phosphorous. In the embodiment depicted in FIG. 3, the first source/drain regions 25a are doped to an n-type conductivity.

Although not depicted in the supplied figures, forming the first source/drain region 25a may also include an epitaxial deposition process for forming an in-situ doped semiconductor material on the portions of the semiconductor surfaces of the semiconductor substrate 5, in which the first source/drain region 25a is desired to be present.

Figure 4:
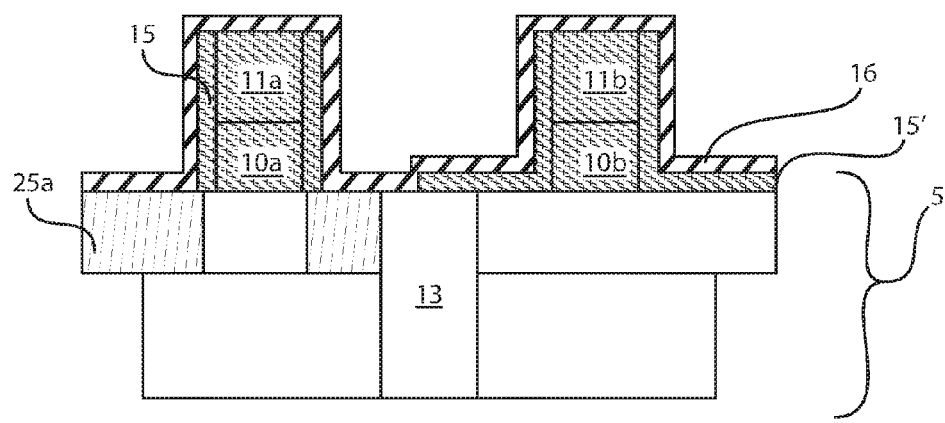
FIG. 4 is a side cross-sectional view depicting depositing a first metal layer for providing a first metal semiconductor alloy on the first source/drain region of the first conductivity type devices.

FIG. 4 depicts one embodiment of depositing a first metal layer 16 for providing a first metal semiconductor alloy for the contact 20a on the first source/drain region 25a of the first conductivity type devices, e.g., n-type vertical field effect transistor (n-type VFET). In some embodiments, prior to depositing the first metal layer 16, the first mask 14 may be removed. The first mask 14 may be removed using chemical striping or selective etching. The method selected for removing the first mask 14 does not remove the remaining portion of the first dielectric layer 15'. The remaining portion of the first dielectric layer 15' can serve as a mask to ensure that the material of the first metal layer 16 does not intermix with the semiconductor material of the first source/drain region 25a of the second conductivity type device 100b, e.g., p-type VFET.

The first metal layer 16 may be blanket deposited using a deposition process that can, but does not necessarily, form a conformal layer. The first metal layer 16 has a composition that is selected to intermix with the semiconductor material of the first source/drain region 25a to form a first metal semiconductor alloy. In some examples, when the first source/drain region 25a is composed of an n-type semiconductor material, the first metal layer 16 may be composed of a titanium containing metal. The first metal layer 16 may be deposited using physical vapor deposition (PVD), chemical vapor deposition (CVD) or atomic layer deposition (ALD) methods. In one example, in which the first metal layer 16 of titanium containing metal is deposited by physical vapor deposition (PVD) method, the deposition process may include sputtering. Examples of sputtering apparatus that may be suitable for depositing the first metal layer 16 include DC diode type systems, radio frequency (RF) sputtering, magnetron sputtering, and ionized metal plasma (IMP) sputtering. In another example, the first metal layer 16 may be formed using a plating processes, such as electroplating or electroless plating. In some other embodiments, the first metal layer 16 may be deposited using chemical vapor deposition (CVD), the chemical vapor deposition (CVD) process may be selected from the group consisting of Atmospheric Pressure CVD (APCVD), Low Pressure CVD (LPCVD) and Plasma Enhanced CVD (PECVD), Metal-Organic CVD (MOCVD) and combinations thereof may also be employed. It is noted that the aforementioned examples of deposition processes are provided for illustrative purposes only, and are not intended to limit the present disclosure, as other deposition processes may be equally applicable.

It is noted that the above titanium containing composition for the first metal layer 16 is illustrative, but not restrictive for some embodiments, e.g., when the first source/drain region 25a is not n-type doped. For example, the first metal layer 16 may also be composed of nickel (Ni), platinum (Pt), tantalum (Ta), hafnium (Hf), tungsten (W), zirconium (Zr), and niobium (Nb), or combinations thereof or combinations further included titanium (Ti). The first metal layer 16 may also be composed of nitrides or nitrogen containing alloys of some of the aforementioned metals, such as titanium nitride (TiN) or tantalum nitride (TaN). The thickness of the first metal layer 16 may range from 1 nm to 30 nm.

In some embodiments, at least one of the first metal layer 16 and the first source/drain region 25a may be doped to increase the conductivity of the subsequently formed metal semiconductor alloy for the first contact 20a to the first source/drain region 25a. For example, if the first source/drain region 25a is doped to an n-type conductivity, the dopant selected to increase the conductivity of the metal semiconductor alloy that provides the first contact 20a may be one of phosphorus (P), arsenic (As) or a combination thereof; and if the first source/drain region 25a is doped to an p-type conductivity, the dopant selected to increase the conductivity of the metal semiconductor alloy that provides the first contact 20a may be one of boron (B), gallium (Ga) or a combination thereof. The dopant may be introduced using ion implantation, or may be introduced in situ during the formation of one of the first metal layer 16 and the semiconductor material that provides the first source/drain region 25a.

Figure 5:
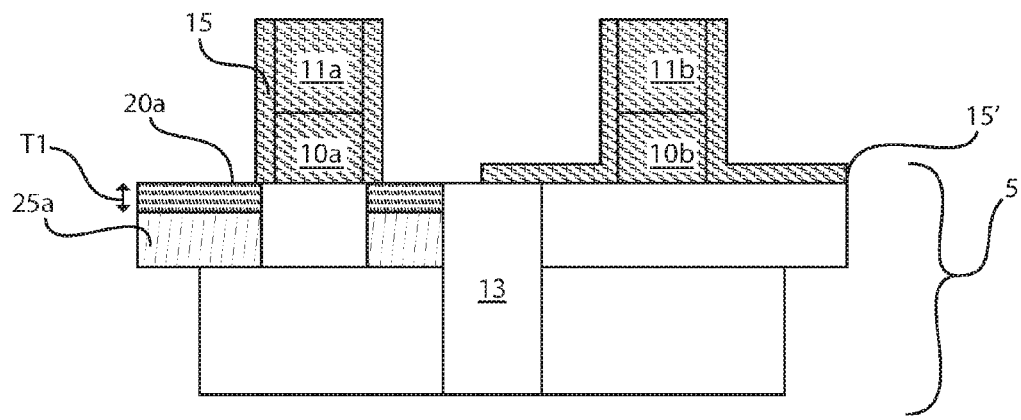
FIG. 5 is a side cross-sectional view depicting an annealing step to intermix the first metal layer with the semiconductor layer underlying the first fin structures to form a first metal semiconductor alloy region that provides a contact to the first source/drain region of the first conductivity type devices.

FIG. 5 depicts an annealing step to intermix the first metal layer 16 with the semiconductor material of the first source/drain region 25a that underlying the first fin structures 10a to form a first metal semiconductor alloy region that provides a first contact 20a to the first source/drain region 25a of the first conductivity type devices, e.g., n-type vertical FET. The remaining portion of the first conformal dielectric layer 15' obstructs the portion of the first metal layer 16 that is present on the second fin structures 10a and the second source/drain region 25b from intermixing with underlying semiconductor material.

The anneal process may be applied to interdiffuse the metal elements from the first metal layer 16 with the semiconductor elements of the first source/drain region 25a to form the metal semiconductor alloy. In one example, when the first metal layer 16 is a titanium metal layer, e.g., substantially 100 wt. % titanium (Ti), and the first source/drain region 25a is composed of n-type silicon (Si), the metal semiconductor alloy that provides the first contact 20a may be titanium silicide (TiSi).

In some embodiments, the annealing process may include furnace annealing, rapid thermal annealing (RTA) and/or pulsed laser annealing. The temperature and time of the anneal process is selected so the deposited metal, e.g., first metal layer 16 including nickel (Ti), reacts with the semiconductor material of the contact surface, e.g., type IV semiconductor (e.g., silicon (Si), germanium (Ge), and/or silicon germanium (SiGe)) forming a metal semiconductor, e.g., silicide. For example, the annealing temperature may range from 300° C. to 750° C., and the time period for the anneal may range from the millisecond range, e.g., 1 millisecond, to on the order of minute, such as 15 minutes, particularly depending upon the anneal process, e.g. laser annealing vs. furnace annealing. Following formation of the metal semiconductor alloy, the unreacted metal, e.g., portion of the first metal layer 16 overlying the first spacers 15, hardmask 11a, and remaining portion of the first dielectric layer 15', may be removed a selective etch.

In one example, the annealing step includes a temperature ranging from 350° C. to 1200° C., and a time period ranging from 50 nanoseconds to 20 minutes.

It is noted that the above anneal process may be applied before, after or during the activation anneal for at least one source/drain region of the semiconductor devices 100a, 100b formed herein.

The first contact 20a provided by the metal semiconductor alloy extends across the entirety of the first source/drain region 25a that is not covered by the first fin structure 10a. First contact 20a may have a thickness T1 that is greater than 2 nm. In another embodiment, the first contact 20a may have a thickness that ranges from 2 nm to 50 nm. As noted above, in some embodiments, the metal semiconductor alloy that provides the first contact 20a may be doped to reduce the contact resistance of the first contact 20a. For example, if the first source/drain region 25a is doped to an n-type conductivity, the dopant selected to increase the conductivity of the metal semiconductor alloy that provides the first contact 20a may be one of phosphorus (P), arsenic (As) or a combination thereof, in which the dopant is present at a concentration ranging from $5 \times 10^{19}$ atoms/cm$^3$ to $5 \times 10^{21}$ atoms/cm$^3$.

Figure 6:
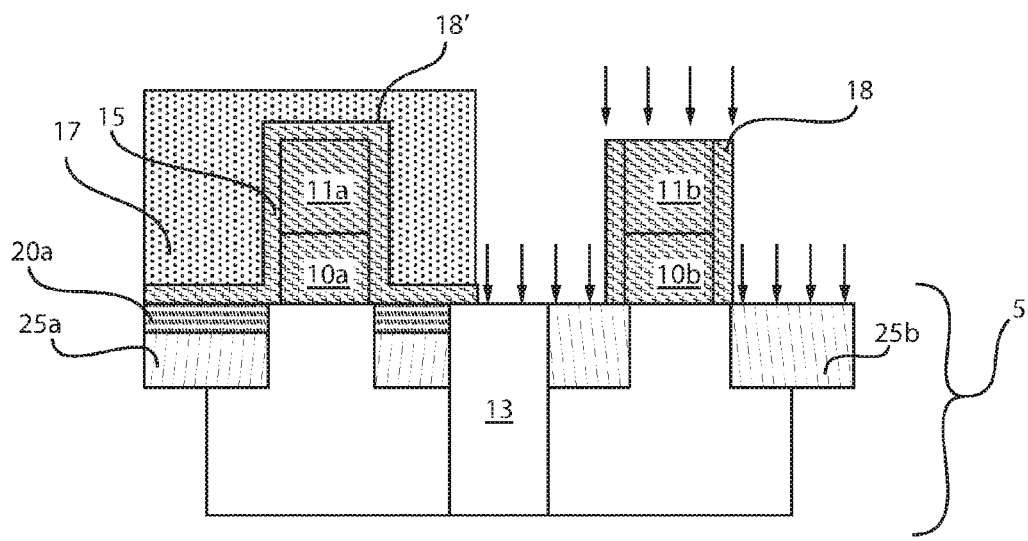
FIG. 6 is a side cross sectional view depicting forming a second mask over the first set of fin structures, and forming a first source/drain region for the second conductivity type devices.

FIG. 6 depicts one embodiment of forming a second mask 17 over the first set of fin structures 10a, and forming a first source/drain region 25b for the second conductivity type devices that use the second fin structures 10b for vertically orientated channel regions. The second mask 17 is similar to the first mask 14 that is depicted in FIG. 3. Therefore, the above description of the first mask 14 that is described above with reference to FIG. 3 is suitable for describing at least one embodiment of the second mask 17 that is depicted in FIG. 6. Additionally, a second spacer 18 may be formed on the sidewalls of the second fin structures 10b. The second spacer 18 is similar to the first spacer 15 that is described above with respect to FIG. 3. Therefore, the above description of the first spacer 15, as well as its method of formation, is suitable for describing at least one embodiment of the second spacer 18. Following the formation of the second spacer 18, the first source/drain region 25b corresponding to the devices that employ the second fin structures 10b as vertically orientated channel regions may be formed using ion implantation or other similar doping method. The first source/drain region 25b depicted being formed in FIG. 6 is similar to the source/drain region that is described above being formed for the devices that employ the first fin structures 10a for vertically orientated channels with the exception that the different source/drain regions 25a, 25b may have opposite conductivity types. For example, the first source/drain regions 25a for the devices using the first fin structures 10a as a vertically orientated channel region may be doped to an n-type conductivity, while the first source/drain regions 25b for the devices using the second fin structures 10b as the vertically oriented channel region may be doped to a p-type conductivity. The devices having opposing conductivity types may be arranged in a complementary metal oxide semiconductor (CMOS) device arrangement. Because the first source/drain regions 25a that are adjacent to the first fin structure 10a are similar to the first source/drain regions 25b that are adjacent to the second fin structures 10b, further details for producing the first source/drain region 25b adjacent the second fin structure 10b depicted in FIG. 6 are provided above by the description of the first source/drain region 25a adjacent to the first fin structure 10a that refers to FIG. 3.

Figure 7:
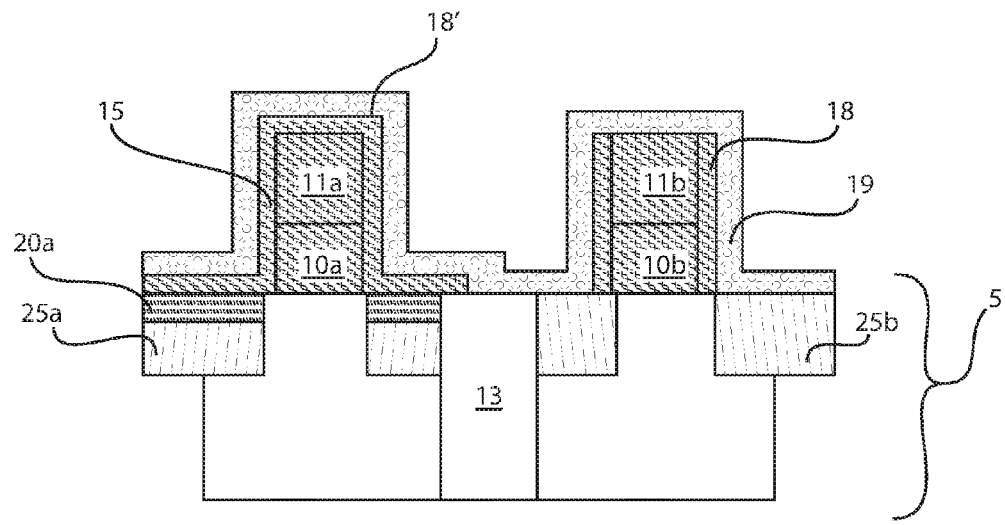
FIG. 7 is a side cross-sectional view depicting depositing a second metal layer for providing a second metal semiconductor alloy on the first source/drain region of the second conductivity type devices.

FIG. 7 depicts one embodiment of depositing a second metal layer 19 for providing a second metal semiconductor alloy for a second contact 25b on the first source/drain region of the second conductivity type devices. Similar to the process flow described above for forming the first contact 25a, a remaining portion of the dielectric layer used to form the spacer 18, i.e., remaining portion 18' of the second dielectric layer for forming the spacer 18, can serve as a mask to ensure that the material of the second metal layer 19 does not intermix with the semiconductor material of the first source/drain region 25a of the first conductivity type device 100a, e.g., n-type VFET.

The second metal layer 19 may be blanket deposited using a deposition process that can, but does not necessarily, form a conformal layer. The second metal layer 19 has a composition that is selected to intermix with the semiconductor material of the first source/drain region 25b to form a second metal semiconductor alloy that provides the second contact 20b. In some examples, when the first source/drain region 25b is composed of a p-type semiconductor material, the second metal layer 19 may be composed of a titanium containing metal. In some other example, the second metal layer may also include platinum, e.g., be an alloyed layer of titanium and platinum. The second metal layer 19 may be deposited using physical vapor deposition (PVD), chemical vapor deposition (CVD) or atomic layer deposition (ALD) methods. In one example, in which the second metal layer 19 is deposited by physical vapor deposition (PVD) method, the deposition process may include sputtering. Examples of sputtering apparatus that may be suitable for depositing the second metal layer 19 include DC diode type systems, radio frequency (RF) sputtering, magnetron sputtering, and ionized metal plasma (IMP) sputtering. In another example, the second metal layer 19 may be formed using a plating processes, such as electroplating or electroless plating. In some other embodiments, the second metal layer 19 may be deposited using chemical vapor deposition (CVD), the chemical vapor deposition (CVD) process may be selected from the group consisting of Atmospheric Pressure CVD (APCVD), Low Pressure CVD (LPCVD) and Plasma Enhanced CVD (PECVD), Metal-Organic CVD (MOCVD) and combinations thereof may also be employed. It is noted that the aforementioned examples of deposition processes are provided for illustrative purposes only, and are not intended to limit the present disclosure, as other deposition processes may be equally applicable.

It is noted that the above compositions of titanium and/or platinum for the second metal layer 19 is illustrative, but not restrictive for some embodiments, e.g., when the second source/drain region 25b is not p-type doped. For example, the second metal layer 19 may also be composed of nickel (Ni), platinum (Pt), tantalum (Ta), hafnium (Hf), tungsten (W), zirconium (Zr), and niobium (Nb), or combinations thereof or combinations further included titanium (Ti). The second metal layer 19 may also be composed of nitrides or nitrogen containing alloys of some of the aforementioned metals, such as titanium nitride (TiN) or tantalum nitride (TaN). The thickness of the second metal layer 19 may range from 1 nm to 30 nm.

In some embodiments, at least one of the second metal layer 19 and the first source/drain region 25b may be doped to increase the conductivity of the subsequently formed metal semiconductor alloy for the second contact 20b to the first source/drain region 25b. For example, if the second source/drain region 25b is doped to a n-type conductivity, the dopant selected to increase the conductivity of the metal semiconductor alloy that provides the second contact 20b may be one of phosphorus (P), arsenic (As) or a combination thereof; and if the second source/drain region 25b is doped to an n-type conductivity, the dopant selected to increase the conductivity of the metal semiconductor alloy that provides the second contact 20b may be one of boron (B), gallium (Ga) or a combination thereof. The dopant may be introduced using ion implantation, or may be introduced in situ during the formation of one of the second metal layer 19 and the semiconductor material that provides the first source/drain region 25b adjacent to the second fin structures 10b.

Figure 8:
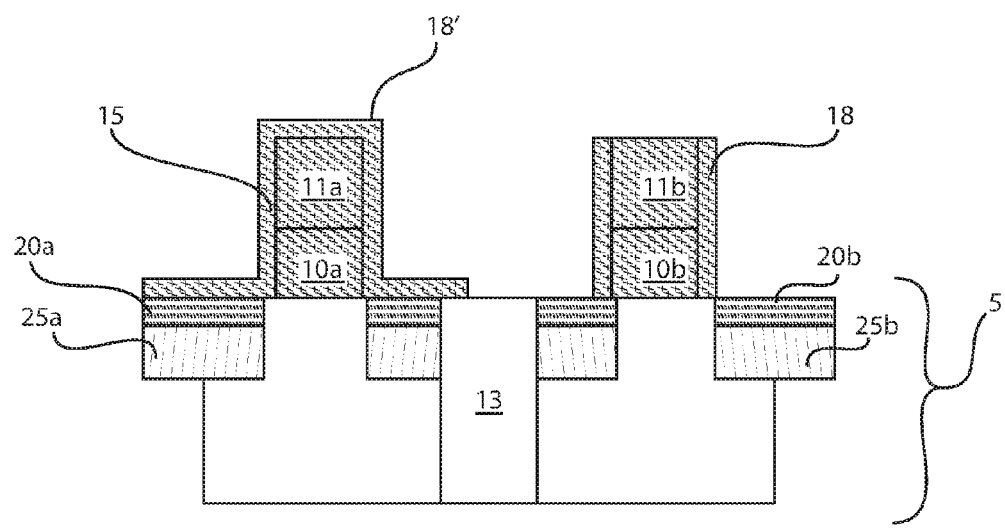
FIG. 8 is a side cross-sectional view depicting an annealing step to intermix the second metal layer with the semiconductor layer underlying the second fin structures to form a second metal semiconductor alloy region that provides a contact to the first source/drain region of the second conductivity type devices.

FIG. 8 depicts an annealing step to intermix the second metal layer 19 with the semiconductor material of the first source/drain region 25b that is underlying the second fin structures 10b to form a second metal semiconductor alloy region that provides a second contact 20b to the first source/drain region 25b of the second conductivity type devices, e.g., p-type vertical FET. The remaining portion of the conformal dielectric layer 18' that forms the spacer 18 abutting the second fin structures 10b obstructs the portion of the second metal layer 19 that is present on the second fin structures 10b and the first source/drain region 25b from intermixing with underlying semiconductor material.

The anneal process may be applied to interdiffuse the metal elements from the second metal layer 19 with the semiconductor elements of the first source/drain region 25b to form the metal semiconductor alloy. In one example, when the second metal layer 19 is a titanium and platinum metal layer, and the first source/drain region 25b is composed of p-type silicon (Si), the metal semiconductor alloy that provides the second contact 20a may be titanium platinum silicide (TiSi). In some embodiments, the annealing process may include furnace annealing, rapid thermal annealing (RTA) and/or pulsed laser annealing. The temperature and time of the anneal process is selected so the deposited metal, e.g., second metal layer 19 including nickel (Ti) and in some examples platinum (Pt), reacts with the semiconductor material of the contact surface, e.g., type IV semiconductor (e.g., silicon (Si), germanium (Ge), and/or silicon germanium (SiGe)) forming a metal semiconductor, e.g., silicide. For example, the annealing temperature may range from 300° C. to 750° C., and the time period for the anneal may range from the millisecond range, e.g., 1 millisecond, to on the order of minute, such as 15 minutes, particularly depending upon the anneal process, e.g. laser annealing vs. furnace annealing. Following formation of the metal semiconductor alloy, the unreacted metal, e.g., portion of the second metal layer 19 overlying the second spacers 18, hardmask 11b, and remaining portion of the second dielectric layer 18', may be removed a selective etch. It is noted that the above anneal process may be applied before, after or during the activation anneal for at least one source/drain region of the semiconductor devices 100a, 100b formed herein.

The second contact 20b provided by the metal semiconductor alloy extends across the entirety of the first source/drain region 25b that is not covered by the second fin structure 10b. The second contact 20b may have a thickness T2 that is greater than 2 nm. In another embodiment, the second contact 20b may have a thickness that ranges from 2 nm to 50 nm. As noted above, in some embodiments, the metal semiconductor alloy that provides the second contact 20b may be doped to reduce the contact resistance of the second contact 20b. For example, if second source/drain region 25b is doped to a p-type conductivity, the dopant selected to increase the conductivity of the metal semiconductor alloy that provides the second contact 20a may be one of boron (B), gallium (Ga) or a combination thereof, in which the dopant is present at a concentration ranging from $5 \times 10^{19}$ atoms/cm$^3$ to $5 \times 10^{21}$ atoms/cm$^3$.

Figure 9:
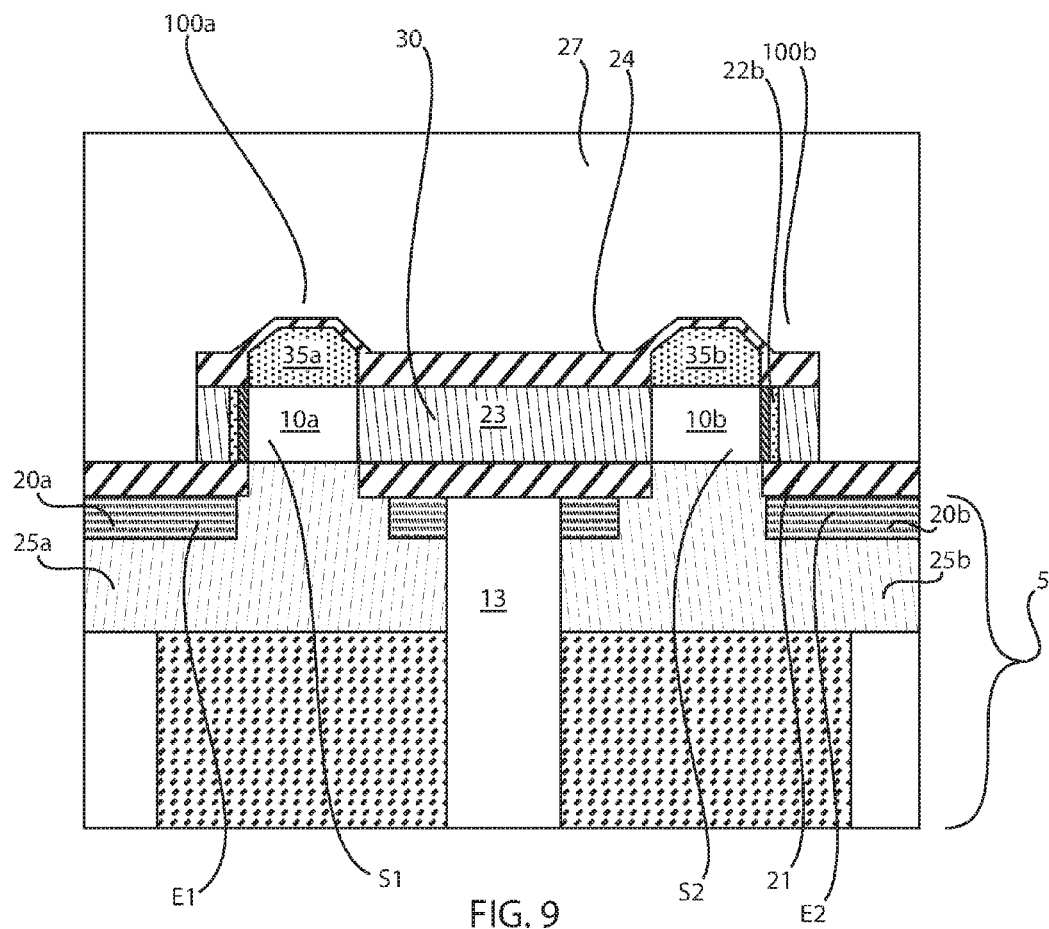
FIG. 9 is a side cross-sectional view depicting forming a bottom spacer followed by the formation of a gate structure to the first and second set of fin structures, and forming a second source/drain region for each of the first and second set of fin structures, in accordance with one embodiment of the present disclosure.

FIG. 9 depicts forming a bottom spacer 21 followed by the formation of a gate structure 22a, 22b, 23 to the first and second set of fin structures 10a, 10b, and forming a second source/drain region 35a, 35b for each of the first and second set of fin structures 10a, 10b. The bottom spacer 21 may be formed using deposition process, such as chemical vapor deposition (CVD). The bottom spacer 21 may be composed of any dielectric material, such as an oxide, nitride or oxynitride material. In some embodiments, the bottom spacer 21 is composed of a low-k dielectric material. As used herein, the term "low-k" denotes a dielectric material having a dielectric constant equal to the dielectric constant of silicon nitride ($Si_3N_4$) or less. The bottom spacer 21 typically has a dielectric constant that is less than 7.0, e.g., 5.5. In one embodiment, the first low-k dielectric material has a dielectric constant ranging from 3.9 to 6. In another embodiment, the first low-k dielectric material has a dielectric constant less than 3.9. Examples of materials suitable for the bottom spacer 21 include diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SiLK™), spin-on silicone based polymeric dielectric (e.g., hydrogen silsesquioxane (HSQ) and methylsilsesquioxane (MSQ), and combinations thereof.

Still referring to FIG. 9, following the formation of the bottom spacer 21, the gate structure 22a, 22b, 23 may be formed atop the bottom spacer 21 and on the fin structures 10a, 10b. In the embodiment depicted in FIG. 9, a single gate structure 22a, 22b, 23 may provide the gate structure for both the devices including the first fin structures 10a for channel regions, and the second fin structures 10b for channel regions. In some other embodiments, a first gate structure may be formed for the semiconductor devices using the first fin structures 10a for channel regions, and a second gate structure may be formed for the semiconductor devices using the second fin structures 10b for channel regions, in which the first gate structure is separate from the second gate structure.

The gate structure that is depicted in FIG. 9 may include a gate dielectric 22a, a work function metal 22b and a gate conductor 23. The gate dielectric 22a is formed directly on the bottom spacer 21 and on the sidewalls of the fin structures 10a, 10b. Typically, the gate dielectric 22a is formed using a conformal deposition process. The gate dielectric 22a may be composed of any dielectric material, such as an oxide, nitride or oxynitride material. In some embodiments, the gate dielectric 22a is a high-k dielectric material. As used herein, "high-k" denotes a dielectric material featuring a dielectric constant (k) higher than the dielectric constant of $SiO_2$ at room temperature. For example, the gate dielectric layer 22a may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the gate dielectric 22a include hafnium silicate, hafnium silicon oxynitride or combinations thereof. The gate dielectric 22a may be deposited using atomic layer deposition (ALD). In other embodiments, the gate dielectric 22a may be deposited using chemical vapor deposition methods, such as plasma enhanced chemical vapor deposition (PECVD). In one embodiment, the gate dielectric 22a has a thickness ranging from about 1.0 nm to about 6.0 nm.

Following formation of the gate dielectric 22a, a work function metal layer of the gate conductor 22b may be deposited. The work function metal may be selected to provide a p-type work function metal layer and an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TiC, TaN, TaC, TiN, HfN, HfSi, or combinations thereof. In some embodiments, a n-type work function metal layer may be formed on the gate dielectric 22a that is present on the first fin structures 10a, and a p-type work function metal layer may be formed on the gate dielectric 22a that is present on the second fin structures 10b. The material layers for the work function metal layer 22b may be deposited using physical vapor deposition (PVD), plating or chemical vapor deposition (CVD).

A gate electrode 23 may then be formed on the work function metal layer 22b. In various embodiments, the gate electrode is a metal, where the metal may be tungsten (W), tungsten nitride (WN) or combinations thereof. In one or more embodiments, the gate electrode 23 is tungsten (W). In other embodiments, the gate electrode 23 may be doped semiconductor material, such as n-type doped polysilicon. The gate electrode may be deposited by CVD, e.g., plasma enhanced chemical vapor deposition (PECVD). The material layers for the gate electrode 23 may be deposited using physical vapor deposition, such as plating, electroplating, electroless deposition, sputtering and combinations thereof.

FIG. 9 further depicts forming an upper spacer 24 atop the gate structure 22a, 22b, 23. Similar to the lower spacer 21, the upper spacer 24 may be composed of a low-k dielectric material. The upper spacer 24 is similar to the lower spacer 21 that is described above. Therefore, the above description of the dielectric material and the method of deposition for the lower spacer 21 is suitable for the description of the composition and method of forming the upper spacer 24.

In some embodiments, the material layers for the upper spacer 24, the gate electrode 23, work function metal layer 22b, gate dielectric layer 22a and the lower spacer 21 are patterned and etched to provide the gate structure using photolithography and etch processing.

In some embodiments, the material layer that provides the upper spacer 24 is patterned and etched to expose an upper surface of the fin structures 10a, 10b to provide the deposition surface for forming the second source/drain regions 35a, 35b. The second source/drain regions 35a, 35b is formed using an epitaxial deposition process. The second source/drain regions 35a, 35b may be composed of a type IV semiconductor material or a type III-V semiconductor material. The second source/drain region 35a, 35b typically has the same conductivity type as the corresponding first source/drain region 25a, 25b. For example, when the first source/drain region 25a corresponding to the first fin structure 10a has an n-type conductivity, the second source/drain region 35a corresponding to the first fin structure 10a has an n-type conductivity; and when the first source/drain region 25b corresponding to second first fin structure 10b has a p-type conductivity, the second source/drain region 35b corresponding to the first fin structure 10b has a p-type conductivity.

Still referring to FIG. 9, an interlevel dielectric layer 27 be formed covering the first and second semiconductor devices 100a, 100b, e.g., n-type VFET and p-type VFET. The interlevel dielectric 27 may be composed of any dielectric material, such as an oxide, nitride or oyxnitride material. For example, the interlevel dielectric 27 may be composed of any dielectric material used in microelectronic and nanoelectronic structures, which can include $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The interlevel dielectric layer 27 may be deposited using chemical vapor deposition, deposition from solution, spin on deposition and combinations thereof.

FIG. 1 depicts forming interconnects 28a, 28b, 29a, 29b, 30 to the first contacts 20a and second contacts 20b of the first source/drain regions 25a, 25b, the second source/drain regions 35a, 35b and the gate structure 22a, 22b, 23. The interconnect 22 may be produce by forming a via opening through the interlevel dielectric layer 27; and filling the via opening with an electrically conductive material. The via opening may be formed using photolithography and etch processes. For example, a photoresist mask may be formed exposing the portion of the dielectric material layers in which the via opening is to be formed, wherein following formation of the photoresist mask, the via opening may be etched into the interlevel dielectric using an etch process, such as reactive ion etch. The via opening may be filled with a doped semiconductor material, such as n-type doped polysilicon, or a metal, such as copper, aluminum, titanium, tungsten, platinum or combinations thereof, to form the interconnects 28a, 28b, 29a, 29b, 30. The electrically conductive material may be deposited into the via opening using physical vapor deposition (PVD). Examples of PVD processes suitable for depositing the metal for the interconnects 28a, 28b, 29a, 29b, 30 include plating, electroplating, electroless plating, sputtering and combinations thereof. In one embodiment, the interconnects 28a, 28b, 29a, 29b may be strapped.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a structure and method for forming salicide bottom contacts, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a contact to a semiconductor device comprising;
   forming a vertically orientated channel region on semiconductor material layer of a substrate;
   forming a first source/drain region in the semiconductor material layer;
   forming a metal semiconductor alloy contact on the first source/drain region extending along a horizontally orientated upper surface of the first source/drain region that is substantially perpendicular to the vertically orientated channel region, wherein the metal semiconductor alloy contact extends substantially to an interface with the vertically orientated channel region;
   forming a gate structure on the vertically orientated channel region; and forming a second source/drain region on the vertically orientated channel region.

2. The method of claim 1, wherein following forming the vertically orientated channel and before forming the first source/drain region a spacer is formed around the vertically orientated channel region.

3. The method of claim 2, wherein forming the spacer comprises conformally depositing a dielectric layer on the vertically orientated channel region and etching the dielectric layer back, wherein a portion of the semiconductor material layer in which the first source/drain region is exposed, and a remaining portion of the dielectric layer is present on the vertically orientated channel region.

4. The method of claim 2, wherein the first source/drain region is formed using ion implantation of a first dopant type conductivity.

5. The method of claim 4, wherein forming the metal semiconductor alloy comprises:
 depositing a metal layer atop a semiconductor material surface of the first source/drain region;
 annealing the metal layer to interdiffuse metal elements from the metal layer and semiconductor elements from the semiconductor material surface; and
 removing an unreacted portion of the metal layer.

6. The method of claim 5, wherein the metal layer comprises a metal selected from the group consisting of titanium, tantalum, tungsten, platinum, nickel, hafnium, zirconium, and combinations thereof.

7. The method of claim 6, wherein the semiconductor material surface comprises a type IV semiconductor selected from the group consisting of silicon, silicon germanium and a combination thereof.

8. The method of claim 7, wherein the metal layer is formed by a deposition process selected from the group consisting of sputtering, plating, electroplating, electroless plating, atomic layer deposition (ALD), chemical vapor deposition (CVD) and combinations thereof.

9. The method of claim 5, wherein said annealing comprises a forming gas anneal.

10. The method of claim 5, wherein said annealing comprises a temperature ranging from 350° C. to 1200° C., and a time period ranging from 50 nanoseconds to 20 minutes.

11. The method of claim 1, wherein forming the gate structure comprises forming a gate dielectric on the vertically orientated channel region, and forming a gate conductor on the gate dielectric, wherein the gate conductor and the gate dielectric are recessed to expose an end of the vertically orientated channel region.

12. The method of claim 11, wherein font ling the second source/drain region comprises an epitaxial deposition process.

13. A method of forming a contact to a semiconductor device comprising;
 forming a vertically orientated channel region on semiconductor material layer of a substrate;
 forming a first source/drain region in the semiconductor material layer;
 forming a metal semiconductor alloy contact on the first source/drain region extending along a horizontally orientated upper surface of the first source/drain region that is substantially perpendicular to the vertically orientated channel region, wherein the metal semiconductor alloy contact extends substantially to an interface with the vertically orientated channel region, wherein an edge of the metal semiconductor alloy contact is aligned with a sidewall of the vertically orientated channel region;
 forming a gate structure on the vertically orientated channel region; and
 forming a second source/drain region on the vertically orientated channel region.

\* \* \* \* \*